US012794418B2

(12) United States Patent
Lear et al.

(10) Patent No.: US 12,794,418 B2
(45) Date of Patent: Nov. 10, 2026

(54) POWER AMPLIFIER WITH IMPROVED HARMONIC TERMINATION

(71) Applicant: Qorvo US, Inc., Greensboro, NC (US)

(72) Inventors: Kelly M. Lear, Longwood, FL (US); Mark Greene, Wylie, TX (US)

(73) Assignee: Qorvo US, Inc., Greensboro, NC (US)

( * ) Notice: Subject to any disclaimer, the term of this patent is extended or adjusted under 35 U.S.C. 154(b) by 411 days.

(21) Appl. No.: 18/380,977

(22) Filed: Oct. 17, 2023

(65) Prior Publication Data

US 2024/0128937 A1 Apr. 18, 2024

Related U.S. Application Data

(60) Provisional application No. 63/416,746, filed on Oct. 17, 2022.

(51) Int. Cl.
*H03F 3/191* (2006.01)
*H03F 1/32* (2006.01)
*H03F 3/21* (2006.01)

(52) U.S. Cl.
CPC ................. *H03F 1/32* (2013.01); *H03F 3/21* (2013.01); *H03F 2200/225* (2013.01); *H03F 2200/451* (2013.01)

(58) Field of Classification Search
CPC ........... H03F 3/191; H03F 3/193; H03F 3/195
USPC .................................................. 330/302, 305
See application file for complete search history.

(56) References Cited

U.S. PATENT DOCUMENTS 9,882,587 B2 * 1/2018 Feng ........................ H03F 3/245
10,680,561 B2 * 6/2020 Ishihara .................. H03F 3/193
11,394,347 B2 * 7/2022 Gebeyehu ............. H03F 1/0216
12,166,458 B2 * 12/2024 Joshi ........................ H03F 3/245
2019/0165742 A1 * 5/2019 Ishihara .................. H03F 3/195

FOREIGN PATENT DOCUMENTS

CN 205160476 U 4/2016
CN 209134363 U 7/2019

OTHER PUBLICATIONS

Jundi, A. et al., "An Octave High Power Push-Pull Doherty Amplifier With Broadband 2nd Harmonic Termination Control," 2016 IEEE MTT-S International Microwave Symposium (IMS), May 2016, IEEE, 4 pages.
Kim, J. et al., "A High Efficiency and Multi-Band/Multi-Mode Power Amplifier using a Distributed Second Harmonic Termination," Proceedings of the 5th European Microwave Integrated Circuits Conference, Sep. 2010, IEEE, 4 pages.

(Continued)

*Primary Examiner* — Henry Choe
(74) *Attorney, Agent, or Firm* — Withrow & Terranova, P.L.L.C.

(57) ABSTRACT

Embodiments of an amplifier and method of operating an amplifier are disclosed. In some embodiments, the amplifier includes an active device having an input terminal and an output terminal. A harmonic termination is coupled in shunt with respect to the input terminal or the output terminal, wherein the harmonic termination includes a capacitor-shunt inductor-capacitor or similar network. In this manner, the harmonic terminator shapes the waveform of the RF signal without introducing large amounts of capacitance at the fundamental/center operating frequency.

17 Claims, 6 Drawing Sheets

(56) References Cited

OTHER PUBLICATIONS

Lee, C.-S. et al., "Matching Network Using One Control Element for Widely Tunable Antennas," Progress in Electromagnetics Research C, vol. 26, Jan. 2012, pp. 29-42.
Sugiura, T. et al., "High Efficiency Compact Doherty Power Amplifier with Novel Harmonics Termination for Handset Applications" 2018 Asia-Pacific Microwave Conference (APMC), Nov. 2018, IEEE, pp. 455-457.
Wang, B. et al., "Design and Evaluation of a T-Shaped Adaptive Impedance Matching System for Vehicular Power Line Communication," IEEE Access, vol. 8, May 2020, 12 pages.

* cited by examiner

POWER AMPLIFIER WITH IMPROVED HARMONIC TERMINATION

RELATED APPLICATIONS

This application claims the benefit of provisional patent application Ser. No. 63/416,746, filed Oct. 17, 2022, the disclosure of which is hereby incorporated herein by reference in its entirety.

FIELD OF THE DISCLOSURE

This disclosure relates generally to power amplifier and, more specifically, to the harmonic termination of the power amplifiers not operating in class A.

BACKGROUND

Power amplifiers are used to amplify a radio frequency (RF) signal so that the RF signal is at the necessary power level for its application. To increase the efficiency and performance of the power amplifier, harmonic terminations are provided in order to shape the waveform of the RF signal. In other words, harmonic terminations are used to manipulate harmonics based on the characteristics of the power amplifier so that the waveform of the RF signal is shaped in a desired form. Unfortunately, harmonic terminations are also very difficult to match since previously known harmonic terminations introduce unwanted capacitance at the fundamental frequency at the input or output of the power amplifier where they are connected.

SUMMARY

Embodiments of an amplifier and method of operating an amplifier are disclosed. In some embodiments, the amplifier includes an active device having an input terminal and an output terminal. A harmonic termination is coupled in shunt with respect to the input terminal or the output terminal, wherein the harmonic termination includes a capacitor-shunt inductor-capacitor network. In this manner, the harmonic terminator shapes the waveform of the RF signal without introducing large amounts of capacitance.

In some embodiments, an amplifier includes: an active device having an input terminal and an output terminal; and a harmonic termination coupled in shunt with respect to one of the input terminal or the output terminal, wherein the harmonic termination includes a capacitor-shunt inductor-capacitor network. In some embodiments, the harmonic termination is coupled in shunt respect to one of the input terminal or the output terminal at a first node, the capacitor-shunt inductor-capacitor network includes a first capacitor, a second capacitor, and an inductor, wherein: the first capacitor is coupled in series between the first node and a second node in the harmonic termination; the inductor is coupled in shunt with respect to the second node; the second capacitor is connected to the second node. In some embodiments, the harmonic resonator further includes an LC resonator configured to provide harmonic termination. In some embodiments, the inductor is a first inductor and the LC resonator includes a second inductor and a third capacitor, the second inductor being connected in series to the second capacitor and the third capacitor being connected in series with the second inductor. In some embodiments, the third capacitor is connected between the second inductor and a ground node. In some embodiments, the harmonic terminator further includes a third inductor coupled in series between the first node and the first capacitor. In some embodiments, the amplifier is configured to amplify an RF signal, wherein the harmonic terminator is configured to provide a reflection coefficient close to one with an associated angle of approximately 0° at the operating center frequency. In some embodiments, the harmonic terminator is configured to provide the reflection coefficient close to one with an associated angle of approximately 180° at the second harmonic frequency. In some embodiments, the amplifier is configured to amplify an RF signal, wherein the harmonic terminator is configured to appear approximately as an open circuit at the operating center frequency. In some embodiments, the harmonic terminator is configured to appear approximately as a short circuit at the second harmonic frequency.

In some embodiments, an amplifier includes: an active device having an input terminal and an output terminal; and a harmonic termination coupled in shunt with respect to the input terminal or the output terminal, wherein the harmonic termination includes an LC resonator configured to provide harmonic termination and a capacitor and shunt inductor connected to the LC resonator. In some embodiments, the harmonic termination is coupled in shunt respect to one of the input terminal or the output terminal at a first node, the capacitor-shunt inductor network includes a capacitor and an inductor, wherein: the capacitor is coupled in series between the first node and a second node in the harmonic termination; the inductor is coupled in shunt with respect to the second node; In some embodiments, the inductor is a first inductor and the capacitor is a first capacitor and the LC resonator includes a second inductor and a second capacitor, the second inductor being connected in series to the second node and the second capacitor being connected in series with the second inductor. In some embodiments, the second capacitor is connected between the second inductor and a ground node. In some embodiments, the inductor is a first inductor and the capacitor is a first capacitor and the LC resonator includes a second inductor and a second capacitor, the second capacitor being connected in series to the second node and the second inductor being connected in series with the second capacitor. In some embodiments, the second inductor is connected between the second inductor and a ground node. In some embodiments, the amplifier is configured to amplify an RF signal, wherein the harmonic terminator is configured to provide a reflection coefficient close to one with an associated angle of approximately 0° at the operating center frequency; the harmonic terminator is configured to provide the reflection coefficient close to one with an associated angle of approximately 180° at the second harmonic frequency. In some embodiments, the amplifier is configured to amplify an RF signal, wherein the harmonic terminator is configured to appear approximately as an open circuit at the operating center frequency. In some embodiments, the harmonic terminator is configured to appear approximately as a short circuit at the second harmonic frequency.

In some embodiments, a method of operating an amplifier, including: receiving a radio frequency (RF) signal an input terminal of an active device; amplifying the RF signal with the active device; shaping a waveform of the RF signal with a harmonic terminator, wherein the harmonic termination is coupled in shunt with respect to the input terminal or an output terminal of an active device, wherein the harmonic termination includes a capacitor-shunt inductor-capacitor network.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
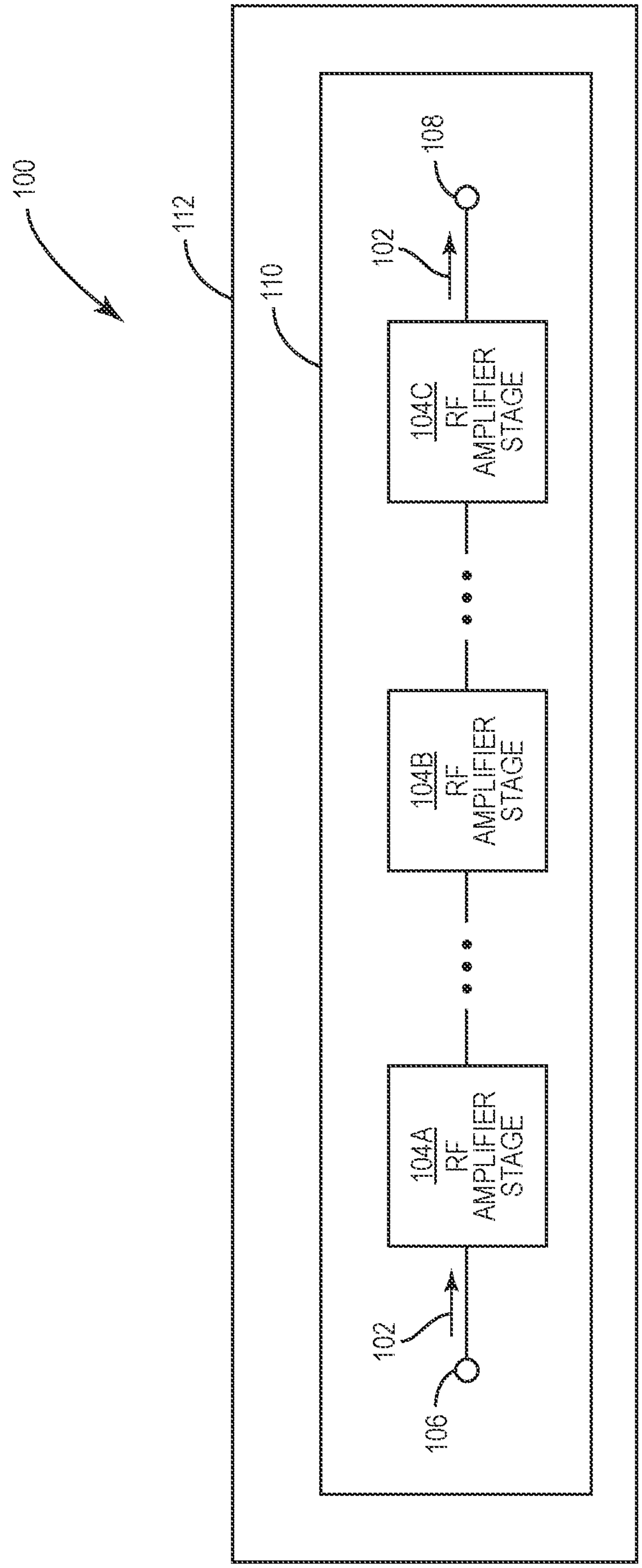
FIG. 1 is a block diagram of a power amplifier, in accordance with some embodiments.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Embodiments of an amplifier and method of operating a power amplifier are disclosed. Disclosed herein are harmonic terminations that are used with the power amplifier. The harmonic terminations are configured to shape the waveform of a radio frequency (RF) signal being amplified by the power amplifier without introducing unwanted impedances that are difficult to match at an input or output of the power amplifier. In some embodiments, the amplifier includes an active device having an input terminal and an output terminal. A harmonic termination is coupled at least partially in shunt with respect to the input terminal or the output terminal. In some embodiments, the harmonic termination includes a capacitor-shunt inductor-capacitor network. These configurations of the harmonic termination shapes the waveform of the RF signal without introducing large amounts of capacitance at the fundamental/operating frequency.

FIG. 1 is a block diagram of a power amplifier 100, in accordance with some embodiments.

The power amplifier 100 is configured to amplify a radio frequency (RF) signal 102. In some embodiments, the power amplifier 100 is part of the front end of a wireless device and is configured to amplify the RF signal so that the RF signal can be transmitted wirelessly through one or more antennas.

In FIG. 1, the power amplifier 100 includes RF amplifier stages (referred to generically as RF amplifier stages 104 and specifically as power amplifier stages 104A, 104B, 104C). The RF signal 102 is amplified sequentially by each of the RF amplifier stages 104. The power amplifier 100 includes an RF input terminal 106 for receiving the RF input signal 102 prior to amplification. The power amplifier 100 includes an RF output terminal 108 for outputting the RF signal 102 after amplification by each of the RF amplifier stages 104.

In FIG. 1, the RF amplifier stage 104A is an initial RF amplifier stage at the beginning of the sequence of the RF amplifier stages 104. The RF amplifier stage 104C is the final RF amplifier stage at the end of the sequence of the RF amplifier stages 104. The RF amplifier stage 104B is an intermediate amplifier stage between the RF amplifier stage 104A and the RF amplifier stage 104C. In some embodiments, the RF amplifier stage 104B is the only intermediate RF amplifier stage. In some embodiments, there are more intermediate RF amplifier stages other than the RF amplifier stage 104B. In some embodiments, there is no intermediate RF amplifier stages and the power amplifier 100 only includes the RF amplifier stage 104A and the RF amplifier stage 104C. In other embodiments, there is a single RF amplifier stage.

In this discussion, a previous amplifier stage refers to an amplifier stage in the sequence of amplifier stages that is closer to the initial RF amplifier stage 104A. In this discussion, a subsequent amplifier stage refers to an amplifier stage in the sequence of amplifier stages that is closer to the final RF amplifier stage 104C.

The power amplifier 100 is formed on a semiconductor die 110. The semiconductor die includes a front end of line (FEOL) with a semiconductor substrate. The semiconductor substrate comprises, in at least one embodiment, silicon, silicon germanium (SiGe), silicon carbide (SiC), gallium arsenic (GaN), or other suitable semiconductor materials. Active regions are formed in or over the substrate, using one or more masks corresponding to one or more active regions in the layout diagrams. The semiconductor die 110 includes an back end of line (BEOL) that includes various metal layers separated by an insulator that are used to create traces to connect the active devices on the FEOL. The semiconductor die 110 is mounted to an integrated circuit (IC) package 112. The IC package 112 is configured to be mounted for connections to external devices, such as a motherboard.

Figure 2:
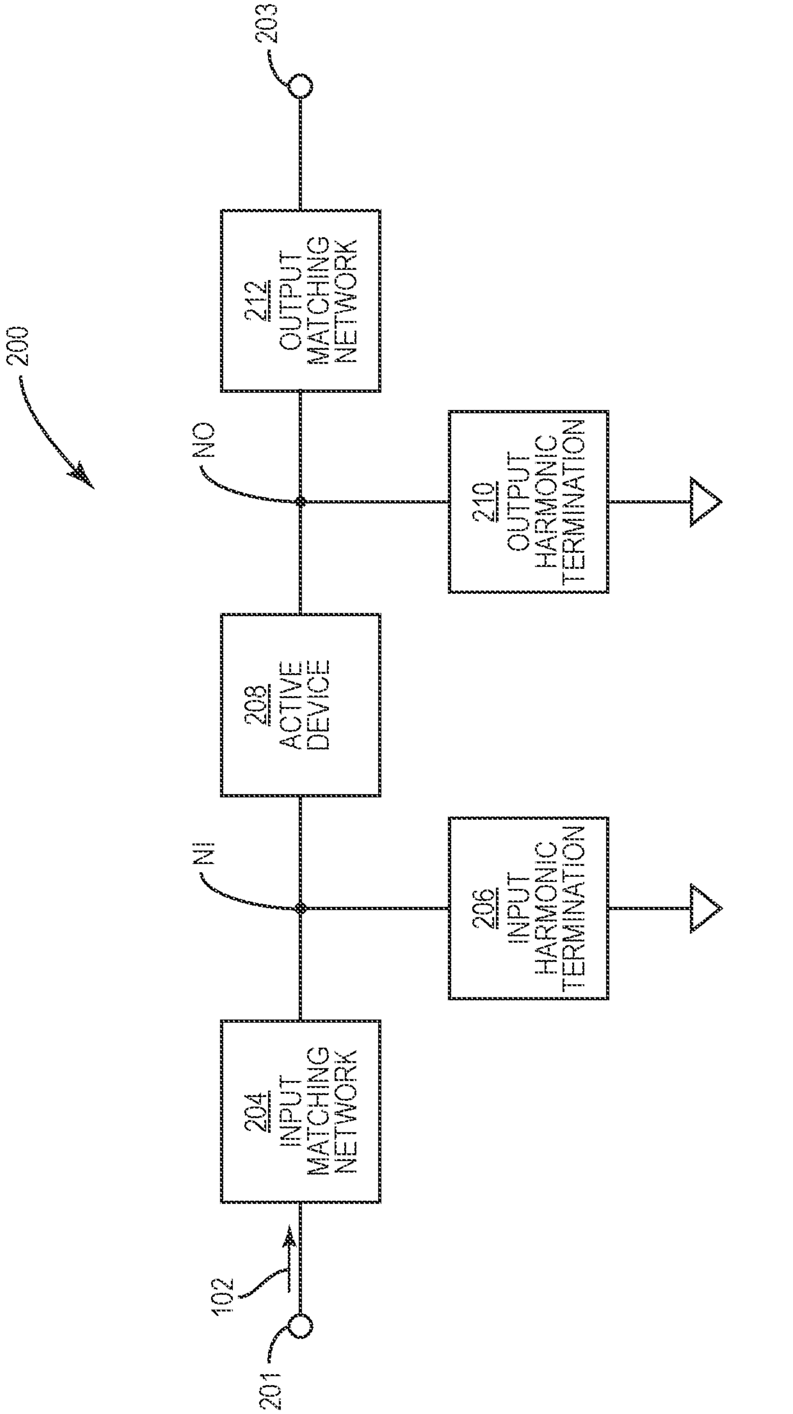
FIG. 2 is a block diagram of an RF amplifier stage, in accordance with some embodiments.

FIG. 2 is a block diagram of an RF amplifier stage 200, in accordance with some embodiments.

Each of the RF amplifier stages 104 in FIG. 1 are provided like the RF amplifier stage 200 in FIG. 2, in accordance with some embodiments. The RF amplifier stage 200 includes an RF input terminal 201 for receiving the RF signal 102 and an RF output terminal 203 for outputting the RF signal 102 from the RF amplifier stage 200.

The RF amplifier stage 200 includes an input matching network 204, an input harmonic termination 206, an active device 208, an output harmonic termination 210, and an output matching network 212. The input matching network 204 is configured to match an impedance at the RF input terminal 201 with an input impedance at an input terminal of the active device 208. A node NI is provided between the input terminal of the active device 208 and the input matching network 204. The input harmonic termination 206 is coupled at least partially in shunt at the node NI.

The output matching network 212 is configured to match an impedance at the RF output terminal 203 with an output impedance at an output terminal of the active device 208. A node NO is provided between the output terminal of the active device 208 and the output matching network 212. The output harmonic termination 210 is coupled at least partially in shunt at the node NO. In some embodiments, the input matching network 204 of a previous RF amplifier stage is the output matching network 212 of the subsequent RF amplifier stage. In some embodiments, the input harmonic termination 206 of a previous RF amplifier stage is the output harmonic termination 210 of the subsequent RF amplifier stage. In some embodiments, there is no output harmonic termination 210. In some embodiments, there is no input harmonic termination 206.

With respect to the input harmonic termination 206 and the output harmonic termination, the harmonic termination is not an RF filter. RF filters filter out unwanted noise and harmonics from the RF signal 102. Harmonic termination is provided to shape the waveform of the RF signal 102. Waveform shaping is performed by providing resonances at specific frequencies, and/or by reflecting and/or removing certain frequencies from the output.

In some embodiments, the input harmonic termination 206 and the output harmonic termination 210 provide a reflection coefficient close to one and has an associated angle of about 0° at the operating center frequency of the RF signal 102 thereby providing approximately an open circuit at the operating center frequency. In some embodiments, there is also a reflection coefficient close to one, but at associated angle of about 180° at the harmonic frequencies (2*operating center frequency), thereby providing a low impedance (e.g., approximately a short circuit) at the $2^{nd}$ harmonic frequency. This open at the operating/fundamental frequency allows the RF amplifier stage 200 to be more easily impedance matched to provide wideband amplification than the capacitance at the operating/fundamental frequency that is provided by prior art.

The active device 208 is configured to amplify the RF signal 102. In some embodiments, the active device 208 is a field effect transistor (FET). In some embodiments, the active device 208 is a bipolar junction transistor (BJT). In some embodiments, the active device 208 is a network of FETs, BJTs, and/or another comparable active semiconductor device to provide amplification. The active device 208 is configured to amplify the magnitude of the RF signal 102 by a factor that is generally greater than 1.

Figure 3:
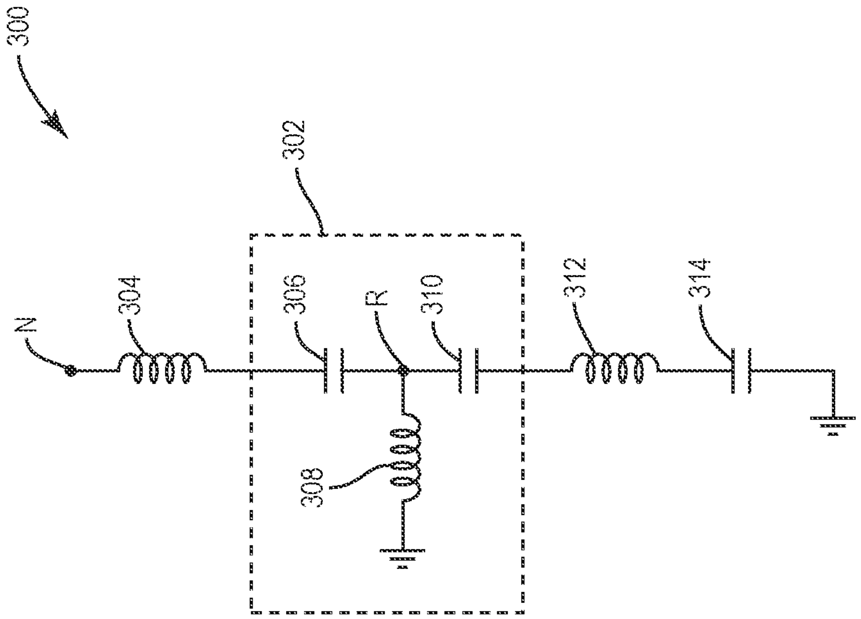
FIG. 3 is an embodiment of a harmonic termination, in accordance with some embodiments.

FIG. 3 is an embodiment of a harmonic termination 300, in accordance with some embodiments.

In some embodiments, the input harmonic termination 206 in FIG. 2 is provided as the harmonic termination 300. In some embodiments, the output harmonic termination 210 in FIG. 2 is provided as the harmonic termination 300.

The harmonic termination 300 is connected in shunt at the node N. In some embodiments, the node N is the node NI in FIG. 2. In some embodiments, the node N is the node NO in FIG. 2.

The harmonic termination 300 includes a capacitor-shunt inductor-capacitor network 302 connected between a node N and an LC resonator configured to provide harmonic termination. An inductive element 304 in series with a capacitive element 306 are connected in series between the node N and a node R. In some embodiments, the inductive element 304 is a wire bond. An inductive element 308 is connected in shunt at node R. A capacitive element 310 is connected to the node R. The LC resonator is formed by the inductive element 312 and the capacitive element 314, which are connected in series. The inductive element 312 is connected in series with the capacitive element 310 of the capacitor-shunt inductor-capacitor network 302. The capacitor-shunt inductor-capacitor network 302 includes the capacitive element 306, the inductive element 308, and the capacitive element 310. In other embodiments, additional capacitive and inductive elements are connected to the capacitor-shunt inductor-capacitor network 302. For example, between the node N and the LC resonator, a capacitor-shunt inductor-capacitor-shunt inductor network or a capacitor-shunt inductor-capacitor-shunt inductor network could be provided in other embodiments.

In FIG. 3, the harmonic termination 300 looks approximately like an open circuit to the operating center frequency of the RF signal 102 (See FIG. 1 and FIG. 2) while introducing little to no capacitance at the fundamental/operating frequency.

Alternative embodiments may be more optimized for transistors in a surface mount package, and may not include the inductive element 304. In alternative embodiments, the capacitive elements 310, 314 are provided by one capacitor, which saves space and/or component costs. In other embodiments, the harmonic termination 300 may include a higher or lower order CLC/highpass networks.

Figure 4A:
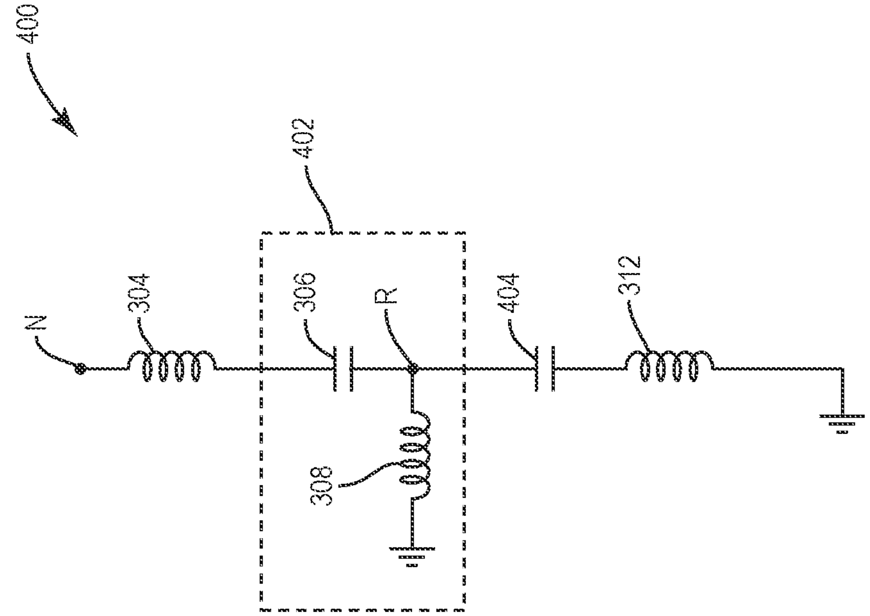
FIGS. 4A and 4B show embodiments of a harmonic termination, in accordance with some embodiments.

FIG. 4A is an embodiment of a harmonic termination 400, in accordance with some embodiments.

In some embodiments, the input harmonic termination 206 in FIG. 2 is provided as the harmonic termination 400. In some embodiments, the output harmonic termination 210 in FIG. 2 is provided as the harmonic termination 400. In some embodiments, the node N is the node NI in FIG. 2. In some embodiments, the node N is the node NO in FIG. 2. The harmonic termination 400 is similar to the harmonic termination 300 shown in FIG. 3, except that a capacitor-shunt inductor network 402 is connected in front of the LC resonator that provides harmonic termination. The harmonic termination 400 includes the inductive element 304 described above. Furthermore, the capacitor-shunt inductor network 402 includes the capacitive element 306 and the shunt inductive element 308 described above. Furthermore, the LC resonator includes the inductive element 312 described above. However, in this embodiment, the LC resonator includes the capacitive element 404 connected between the node R and the inductive element 312. The inductive element 312 has a series connection with the capacitive element 404 and is connected between the capacitive element 404 and the ground node. The capacitance of the capacitive element 404 in FIG. 4A is configured to be equivalent to the combination of the capacitance of the capacitive element 310 and the capacitive element 314 in FIG. 3. The harmonic termination 400 looks approximately like an open circuit to the operating center frequency of the RF signal 102 (See FIG. 1 and FIG. 2) while introducing little to no capacitance.

Figure 4B:
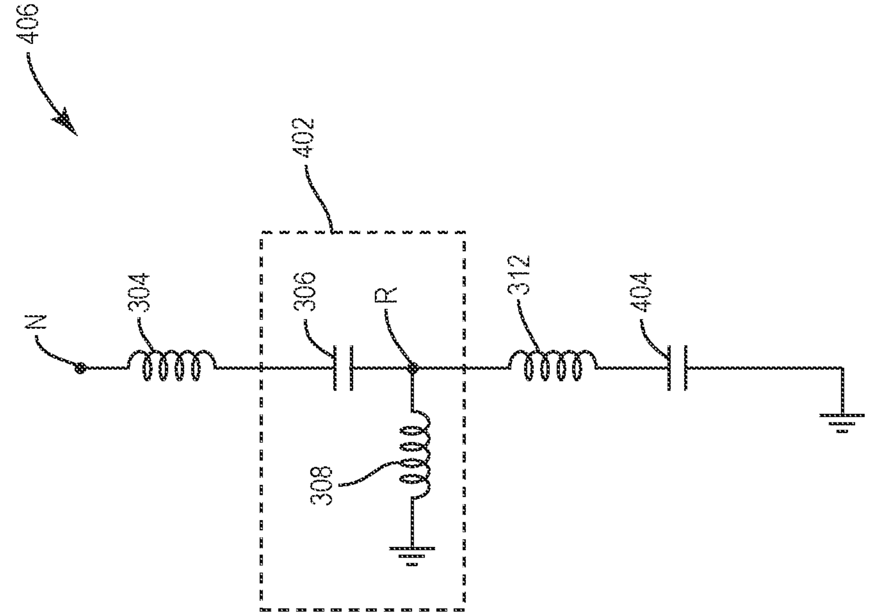

FIG. 4B is an embodiment of a harmonic termination 406, in accordance with some embodiments.

In some embodiments, the input harmonic termination 206 in FIG. 2 is provided as the harmonic termination 400. In some embodiments, the output harmonic termination 210 in FIG. 2 is provided as the harmonic termination 400. In some embodiments, the node N is the node NI in FIG. 2. In some embodiments, the node N is the node NO in FIG. 2.

The harmonic termination 406 is FIG. 4B is the same as the harmonic termination 400 in FIG. 4A, except that the position of the inductive element 312 and the capacitive element 404 is switched. In this embodiment, the inductive element 312 is connected to the node R and the capacitive element 404 is connected between the inductive element 312 and the ground node.

Figure 5:
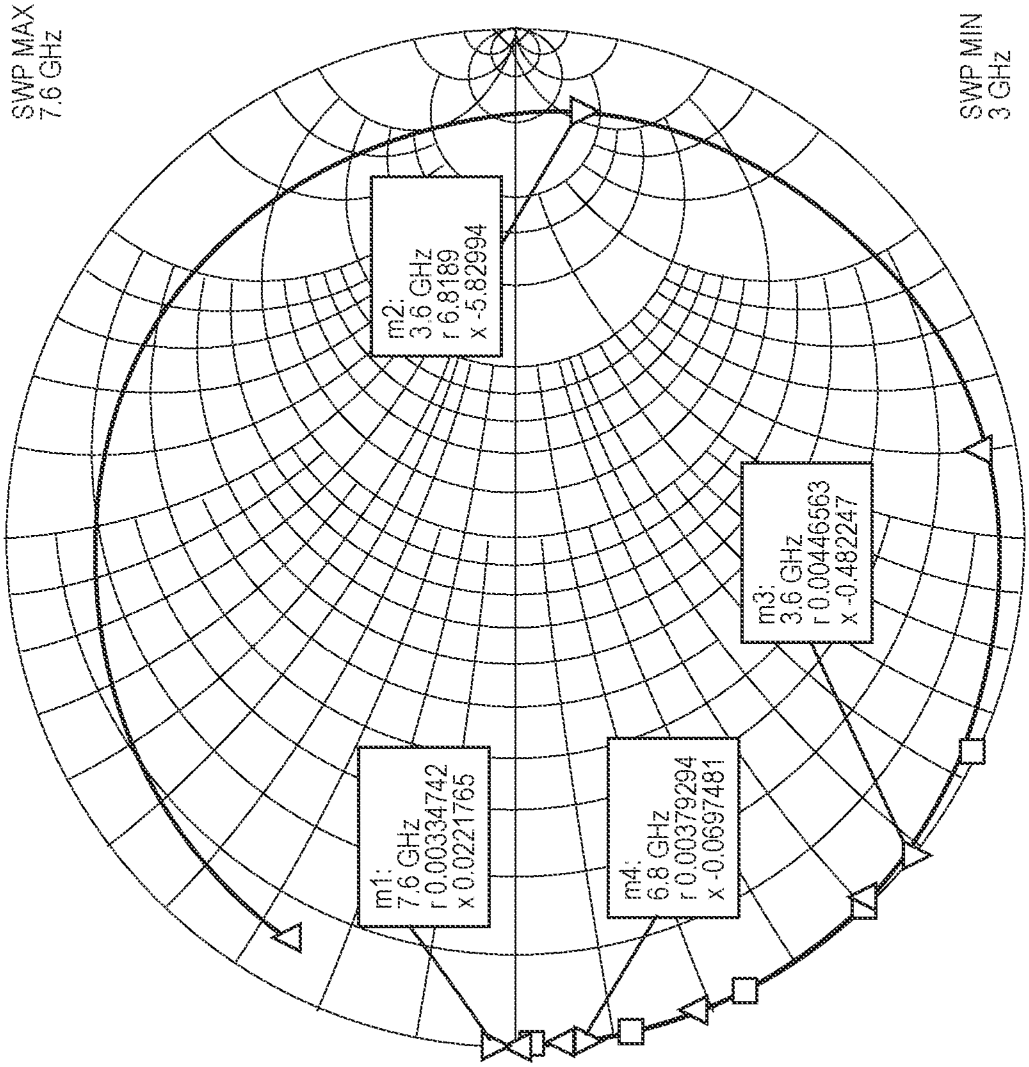
FIG. 5 is a Smith chart that demonstrates the impedance performance of the harmonic termination of FIG. 3 as the harmonic termination of FIGS. 4A and 4B as the harmonic termination in FIG. 2, in accordance with some embodiments.

FIG. 5 is a Smith chart 500 that demonstrates the impedance performance of the harmonic termination 300 of FIG. 3 (this work) as the input harmonic termination 206 and another harmonic termination 300 of FIG. 3 as the output harmonic termination 210 in FIG. 2, in accordance with some embodiments.

In particular, the Smith chart 500 points m1, m2 demonstrate the performance of the harmonic termination 300 of FIG. 3 where the operating center frequency of the RF signal 102 (see FIG. 1 and FIG. 2) is 3.6 GHz. As shown by the Smith chart 500, the harmonic termination 300 operates as approximately as an open circuit at 3.6 GHz (See m2) and approximately as a short circuit at the second harmonic (m1). This is nearly ideal behavior. Furthermore, since the harmonic termination 300 operates approximately as an open circuit at 3.6 GHz (See m2), the band of the RF amplifier stage 200 (See FIG. 2) is maintained wide since it does not have to be matched. However, in previously known approaches, the harmonic termination operates more capacitively at 3.6 GHz (See m3) and approximately as a short circuit at near second harmonic (See m4). As a result, the capacitive behavior of the previously known harmonic termination has to be matched thereby reducing the bandwidth.

Figure 6:
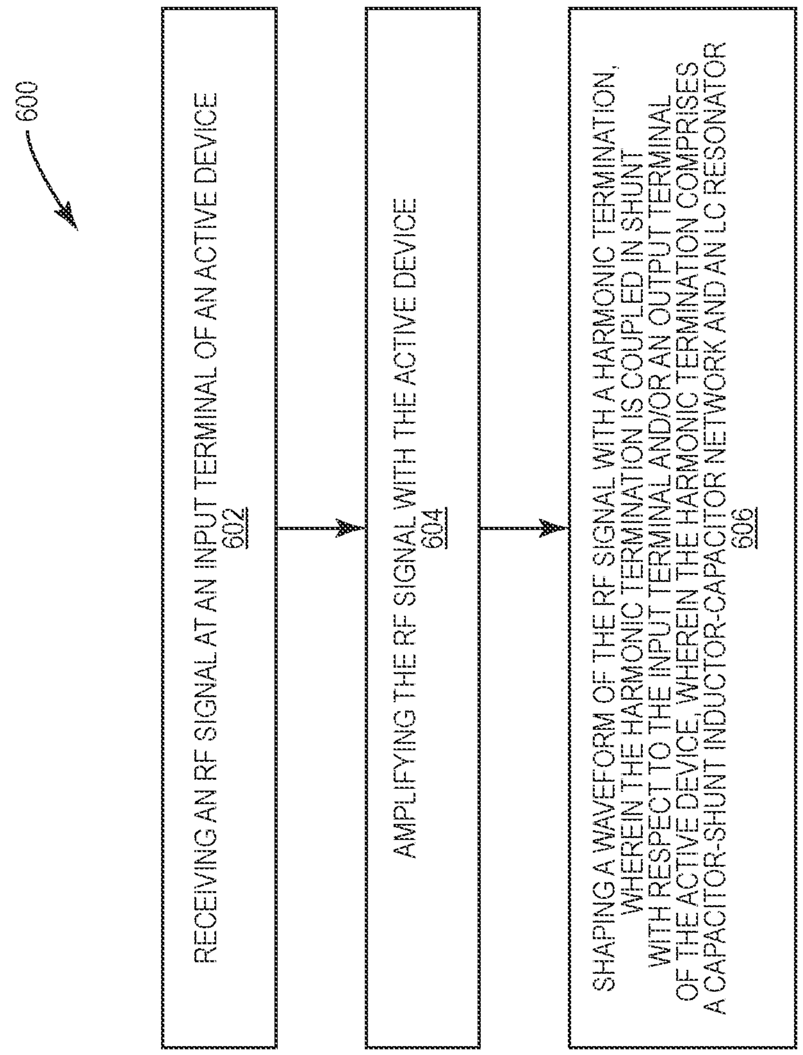
FIG. 6 is a flow diagram of a method of operating a power amplifier, in accordance with some embodiments.

FIG. 6 is a flow diagram 600 of a method of operating a power amplifier, in accordance with some embodiments.

In some embodiments, the flow diagram 600 is performed by the RF amplifier stage 200 shown in FIG. 2. The flow diagram 600 includes blocks 602-606. Flow begins at the block 602.

At the block 602, an RF signal is received an input terminal of an active device. An example of the RF signal is the RF signal 102 in FIG. 1 and FIG. 2. An example of the active device is the active device 208 in FIG. 2. Flow then proceeds to the block 604.

At the block 604, the RF signal is amplified with the active device. Flow then proceeds to the block 606.

At the block 606, a waveform of the RF signal is shaped with a harmonic terminator, wherein the harmonic terminator is coupled in shunt with respect to the input terminal and/or an output terminal of the amplifying device, wherein the harmonic terminator comprises a capacitor-shunt inductor-capacitor network. An example of the harmonic terminator is the harmonic termination 300 in FIG. 3. An example of the capacitor-shunt inductor-capacitor network is the capacitor-shunt inductor-capacitor network 302 in FIG. 3. In other embodiments, a capacitor-shunt inductor network is used rather than a capacitor-shunt inductor-capacitor network. An example of a capacitor-shunt inductor network are the capacitor-shunt inductor network 402 in FIGS. 4A and 4B.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. An amplifier comprising:

an active device having an input terminal and an output terminal; and a harmonic termination coupled in shunt with respect to one of the input terminal or the output terminal, wherein the harmonic termination comprises a capacitor-shunt inductor-capacitor network, wherein the harmonic termination is coupled in shunt with respect to one of the input terminal or the output terminal at a first node, the capacitor-shunt inductor-capacitor network comprises a first capacitor, a second capacitor, and an inductor, wherein:

the first capacitor is coupled in series between the first node and a second node in the harmonic termination;

the inductor is coupled in shunt with respect to the second node; and the second capacitor is connected to the second node.

2. The amplifier of claim 1, wherein the harmonic termination further comprises an LC resonator configured to provide the harmonic termination.

3. The amplifier of claim 2, wherein the inductor is a first inductor and the LC resonator comprises a second inductor and a third capacitor, the second inductor being connected in series to the second capacitor and the third capacitor being connected in series with the second inductor.

4. The amplifier of claim 3, wherein the third capacitor is connected between the second inductor and a ground node.

5. The amplifier of claim 4, wherein the harmonic termination further comprises a third inductor coupled in series between the first node and the first capacitor.

6. The amplifier of claim 1, wherein the amplifier is configured to amplify an RF signal, wherein the harmonic termination is configured to provide a reflection coefficient close to one with an associated angle of approximately 0° at an operating center frequency.

7. The amplifier of claim 6, wherein the harmonic termination is configured to provide the reflection coefficient close to one with an associated angle of approximately 180° at a second harmonic frequency.

8. The amplifier of claim 1, wherein the amplifier is configured to amplify an RF signal, wherein the harmonic termination is configured to appear approximately as an open circuit at an operating center frequency.

9. The amplifier of claim 8, wherein the harmonic termination is configured to appear approximately as a short circuit at a second harmonic frequency.

10. An amplifier comprising:

an active device having an input terminal and an output terminal; and a harmonic termination coupled in shunt with respect to the input terminal or the output terminal, wherein the harmonic termination comprises an LC resonator configured to provide the harmonic termination and a capacitor-shunt inductor-capacitor network connected to the LC resonator, wherein the harmonic termination is coupled in shunt with respect to one of the input terminal or the output terminal at a first node, the capacitor-shunt inductor-capacitor network comprises a first capacitor and a first inductor, wherein:

the first capacitor is coupled in series between the first node and a second node in the harmonic termination;

the first inductor is coupled in shunt with respect to the second node; and the LC resonator comprises a second inductor and a second capacitor, the second inductor being connected in series to the second node and the second capacitor being connected in series with the second inductor.

11. The amplifier of claim 10, wherein the second capacitor is connected between the second inductor and a ground node.

12. The amplifier of claim 10, wherein the inductor is a first inductor, the capacitor is a first capacitor, and the LC resonator comprises a second inductor and a second capacitor, the second capacitor being connected in series to the second node and the second inductor being connected in series with the second capacitor.

13. The amplifier of claim 10, wherein the second inductor is connected between the second capacitor and a ground node.

14. The amplifier of claim 10, wherein:

the amplifier is configured to amplify an RF signal, wherein the harmonic termination is configured to provide a reflection coefficient close to one with an associated angle of approximately 0° at an operating center frequency; and the harmonic termination is configured to provide the reflection coefficient close to one with an associated angle of approximately 180° at a second harmonic frequency.

15. The amplifier of claim 10, wherein the amplifier is configured to amplify an RF signal, wherein the harmonic termination is configured to appear approximately as an open circuit at an operating center frequency.

16. The amplifier of claim 15, wherein the harmonic termination is configured to appear approximately as a short circuit at a second harmonic frequency.

17. A method of operating an amplifier, comprising:

receiving a radio frequency (RF) signal at an input terminal of an active device;

amplifying the RF signal with the active device so as to output the amplified RF signal at an output terminal;

shaping a waveform of the RF signal with a harmonic termination, wherein the harmonic termination is coupled in shunt with respect to the input terminal or the output terminal of the active device, wherein the harmonic termination comprises a capacitor-shunt inductor-capacitor network, wherein the harmonic termination is coupled in shunt with respect to one of the input terminal or the output terminal at a first node, and the capacitor-shunt inductor-capacitor network comprises a first capacitor, a second capacitor, and an inductor, wherein:

the first capacitor is coupled in series between the first node and a second node in the harmonic termination;

the inductor is coupled in shunt with respect to the second node; and the second capacitor is connected to the second node.

* * * * *